(12) United States Patent
Phillips

(10) Patent No.: US 9,668,378 B2
(45) Date of Patent: May 30, 2017

(54) RECEPTACLE ASSEMBLY WITH HEAT EXTRACTION FROM A PLUGGABLE MODULE

(71) Applicant: Tyco Electronics Corporation, Berwyn, PA (US)

(72) Inventor: Michael John Phillips, Camp Hill, PA (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 31 days.

(21) Appl. No.: 14/500,136

(22) Filed: Sep. 29, 2014

(65) Prior Publication Data
US 2016/0093996 A1    Mar. 31, 2016

(51) Int. Cl.
| | |
|---|---|
| H01R 13/502 | (2006.01) |
| H05K 7/20 | (2006.01) |
| G02B 6/42 | (2006.01) |
| H01R 24/60 | (2011.01) |
| H01R 25/00 | (2006.01) |
| H01R 12/72 | (2011.01) |

(52) U.S. Cl.
CPC ......... *H05K 7/20418* (2013.01); *H01R 24/60* (2013.01); *G02B 6/4201* (2013.01); *H01R 12/722* (2013.01); *H01R 13/502* (2013.01); *H01R 25/006* (2013.01); *H05K 7/2049* (2013.01); *H05K 7/20445* (2013.01)

(58) Field of Classification Search
CPC ............... H01R 25/006; H01R 13/502; H05K 7/20418; H05K 7/20445; H05K 7/2049; G02B 6/4292; G02B 6/4246; G02B 6/4201; G02B 6/4204; G02B 6/4277

USPC ......... 361/715–716; 165/80.1; 174/547–548; 62/3.2, 3.6; 385/92; 439/487

See application file for complete search history.

(56) References Cited

U.S. PATENT DOCUMENTS

| | | | | |
|---|---|---|---|---|
| 7,260,303 B2* | 8/2007 | Bench | ................. | G02B 6/4246 385/134 |
| 7,371,965 B2* | 5/2008 | Ice | ....................... | G02B 6/4201 174/50 |
| 7,764,504 B2* | 7/2010 | Phillips | ............... | G02B 6/4246 165/80.2 |
| 8,885,342 B2* | 11/2014 | Skepnek | ............... | H01L 23/367 174/548 |
| 2008/0218980 A1* | 9/2008 | Tracewell | .......... | H05K 7/20672 361/713 |

(Continued)

*Primary Examiner* — Zachary M Pape

(57) ABSTRACT

A receptacle assembly includes a cage having an interior cavity that includes a port. The cage has a front end that is open to the port. The port is configured to receive a pluggable module therein through the front end of the cage. The cage includes a spring. A heat spreader includes a body having a cage segment that is configured to be mounted to the cage such that the cage segment extends over at least a portion of the cage with a module side of the cage segment facing the port. The body includes an extension segment that extends from the cage segment in a direction generally away from the cage. The extension segment is configured to be engaged in thermal communication with a heat exchanger. The spring is configured to engage the pluggable module when the pluggable module is received within the port such that the spring is configured to press the pluggable module in thermal communication with the module side of the cage segment of the heat spreader.

20 Claims, 9 Drawing Sheets

(56) References Cited

U.S. PATENT DOCUMENTS

2015/0029667 A1\* 1/2015 Szczesny ............ F28D 15/0275
                                                        361/700
2016/0197424 A1\* 7/2016 L'Esperance ........ H01R 12/721
                                                        439/61

\* cited by examiner

RECEPTACLE ASSEMBLY WITH HEAT EXTRACTION FROM A PLUGGABLE MODULE

BACKGROUND OF THE INVENTION

The subject matter described and/or illustrated herein relates generally to pluggable modules, and more particularly to receptacle assemblies for receiving pluggable modules.

Various types of fiber optic and copper based transceiver assemblies that permit communication between host equipment and external devices are known. The transceiver assemblies typically include one or more pluggable modules received within a receptacle assembly, which includes one or more receptacle connectors that pluggably connect to the pluggable module(s). The receptacle assembly typically includes a metal cage having one or more ports that receive the pluggable module(s) therein. The receptacle connector(s) is held in the internal compartment of the cage for connection with the pluggable module(s) as the pluggable module(s) is inserted therein.

Due to increases in the density, power output levels, and/or switching speeds of some pluggable modules, there may be a corresponding increase in heat generated by the pluggable module. The heat generated by the operation of the pluggable modules can lead to significant problems. For example, some pluggable modules may lose performance, or outright fail, if the core temperature of the module rises too high. Known techniques used to control the temperature of pluggable modules include mounting a heat sink to the cage. When the pluggable module is received within the receptacle assembly, the heat sink thermally communicates (e.g., engages in physical contact) with the pluggable module to dissipate heat from the module. But, known heat sinks may be incapable of dissipating a sufficient amount of heat to account for the increase in heat generated by the newest pluggable modules.

Moreover, some cages include two or more ports arranged in one or more columns and/or rows. The heat sink may only thermally communicate with some of the ports, and therefore may only thermally communicate with some of the pluggable modules, which may lead to overheating of one or more other pluggable modules that are not in thermal communication with the heat sink. For example, when a cage includes upper and lower ports arranged in a vertical column, the heat sink may be mounted along an upper side of the cage for thermal communication with the pluggable module received within the upper port. But, the heat sink does not thermally communicate with the pluggable module that is received within the lower port, which may allow the pluggable module within the lower port to overheat.

BRIEF DESCRIPTION OF THE INVENTION

In an embodiment, a receptacle assembly includes a cage having an interior cavity that includes a port. The cage has a front end that is open to the port. The port is configured to receive a pluggable module therein through the front end of the cage. The cage includes a spring. A heat spreader includes a body having a cage segment that is configured to be mounted to the cage such that the cage segment extends over at least a portion of the cage with a module side of the cage segment facing the port. The body includes an extension segment that extends from the cage segment in a direction generally away from the cage. The extension segment is configured to be engaged in thermal communication with a heat exchanger. The spring is configured to engage the pluggable module when the pluggable module is received within the port such that the spring is configured to press the pluggable module in thermal communication with the module side of the cage segment of the heat spreader.

In an embodiment, a receptacle assembly includes a cage having an interior cavity and a divider that divides the interior cavity into first and second ports. The cage has a front end that is open to the first and second ports. The first and second ports are configured to receive first and second pluggable modules, respectively, therein through the front end. The divider includes an internal compartment that extends between the first and second ports. The cage includes a spring. A heat spreader is configured to be mounted to the cage. The heat spreader includes a divider segment that is configured to extend within the internal compartment of the divider with a module side of the divider segment facing the first port. The heat spreader includes an extension that extends in a direction generally away from the cage and is configured to thermally communicate with the divider segment. The extension is configured to be engaged in thermal communication with a heat exchanger. The spring is configured to engage the first pluggable module when the first pluggable module is received within the first port such that the spring is configured to press the first pluggable module in thermal communication with the module side of the divider segment of the heat spreader.

In an embodiment, a receptacle assembly includes a cage having an interior cavity and a divider that divides the interior cavity into first and second ports. The cage has a front end that is open to the first and second ports. The first and second ports are configured to receive first and second pluggable modules, respectively, therein through the front end. The divider includes an internal compartment that extends between the first and second ports. The cage includes a spring. A heat spreader is configured to be mounted to the cage. The heat spreader includes a divider segment that is configured to extend within the internal compartment of the divider with a module side of the divider segment facing the first port. The heat spreader includes an extension having an extension rail that extends outward from the divider segment and through a wall of the cage in a direction generally away from the cage. The extension is configured to be engaged in thermal communication with a heat exchanger. The divider segment is configured to thermally communicate with the heat exchanger at least partially through the extension rail. The spring is configured to engage the first pluggable module when the first pluggable module is received within the first port such that the spring is configured to press the first pluggable module in thermal communication with the module side of the divider segment of the heat spreader.

DETAILED DESCRIPTION OF THE INVENTION

Figure 1:
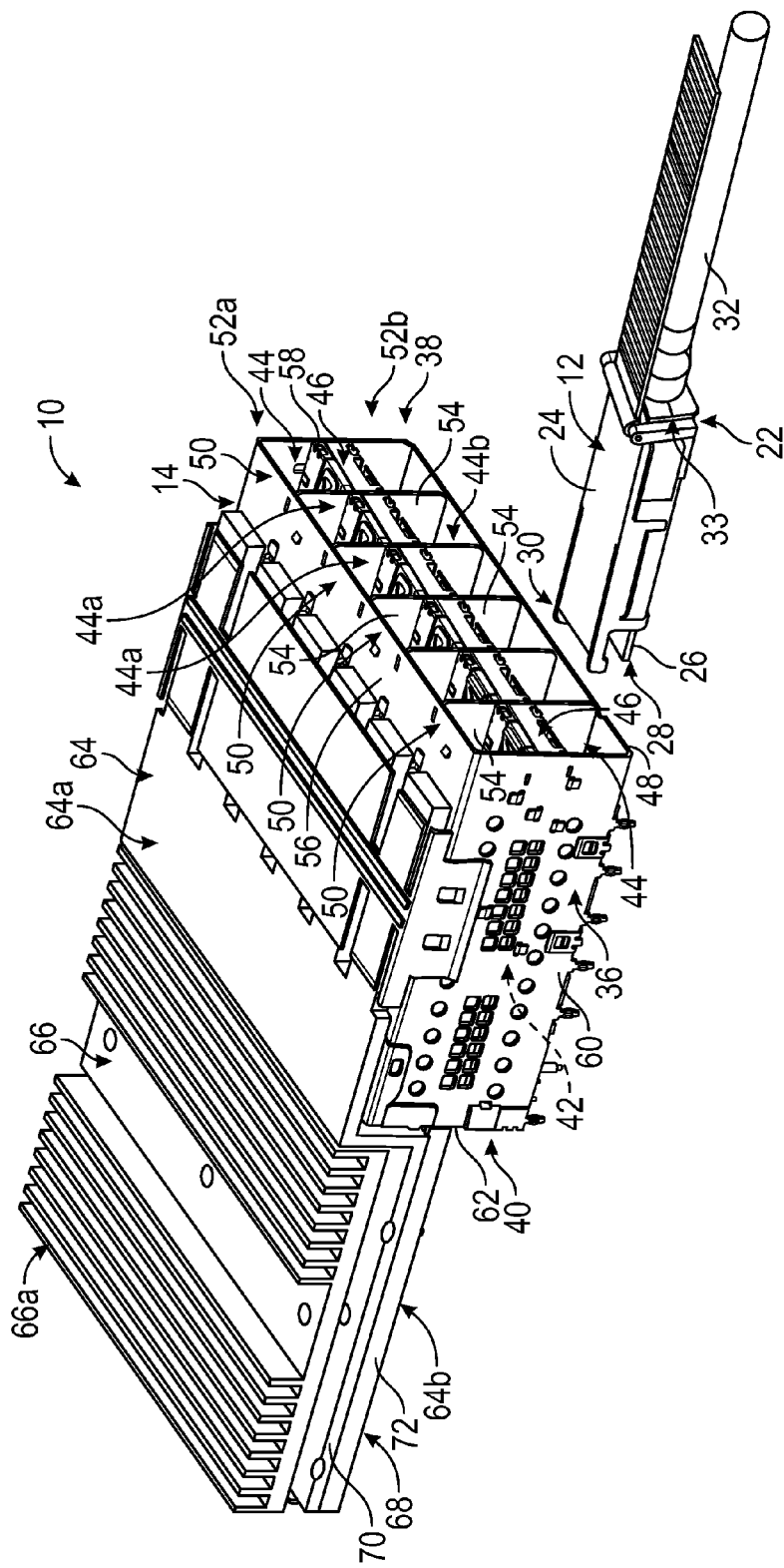
FIG. 1 is a perspective view of an embodiment of a transceiver assembly.

FIG. 1 is a perspective view of an embodiment of a transceiver assembly 10. In the illustrated embodiment, the transceiver assembly 10 is adapted to address, among other things, conveying data signals at high rates, such as, but not limited to, data transmission rates of at least 10 gigabits per second (Gbps), which is required by the SFP+ standard. For example, in some embodiments the transceiver assembly 10 is adapted to convey data signals at a data transmission rate of at least 28 Gbps. Moreover, and for example, in some embodiments the transceiver assembly 10 is adapted to convey data signals at a data transmission rate of between approximately 20 Gbps and approximately 30 Gbps. It is appreciated, however, that the benefits and advantages of the subject matter described and/or illustrated herein may accrue equally to other data transmission rates and across a variety of systems and standards. In other words, the subject matter described and/or illustrated herein is not limited to data transmission rates of 10 Gbps or greater, any standard, nor the exemplary type of transceiver assembly shown and described herein.

The transceiver assembly 10 includes pluggable modules 12 configured for pluggable insertion into a receptacle assembly 14 that is mounted on a host circuit board (not shown). Although the illustrated embodiment includes twelve pluggable modules 12, the transceiver assembly 10 may include any number of pluggable modules 12. Only one pluggable module 12 is shown in FIG. 1 for clarity. The host circuit board may be mounted in a host system (not shown) such as, but not limited to, a router, a server, a computer, and/or the like. The host system typically includes a conductive chassis (not shown) having a panel (not shown) including one or more openings (not shown) extending therethrough in substantial alignment with the receptacle assembly 14. The receptacle assembly 14 is optionally electrically connected to the panel.

The pluggable module 12 is configured to be inserted into the receptacle assembly 14. Specifically, the pluggable module 12 is inserted into the receptacle assembly 14 through the panel opening such that a front end 22 of the pluggable module 12 extends outwardly from the receptacle assembly 14. The pluggable module 12 includes a housing 24 that forms a protective shell for a circuit board 26 that is disposed within the housing 24. The circuit board 26 carries circuitry, traces, paths, devices, and/or the like that perform transceiver functions in a known manner. An edge 28 of the circuit board 26 is exposed at a rear end 30 of the housing 24 for pluggable insertion into a receptacle connector 34 (shown in FIG. 5) of the receptacle assembly 14. In an alternative embodiment, a straddle mount connector (not shown) is mounted to the circuit board 26 and exposed at the rear end 30 of the housing 24 for plugging into the receptacle connector 34.

Each pluggable module 12 interfaces to one or more optical and/or electrical cables 32 through a connector interface 33 at the front end 22 of the module 12. Suitable connector interfaces 33 are known and include, but are not limited to, adapters for the LC style fiber connectors and the MTP/MPO style fiber connectors offered by TE Connectivity (Harrisburg, Pa.). Each pluggable module 12 of the transceiver assembly 10 may be referred to herein as a "first pluggable module" and/or a "second pluggable module".

Figure 2:
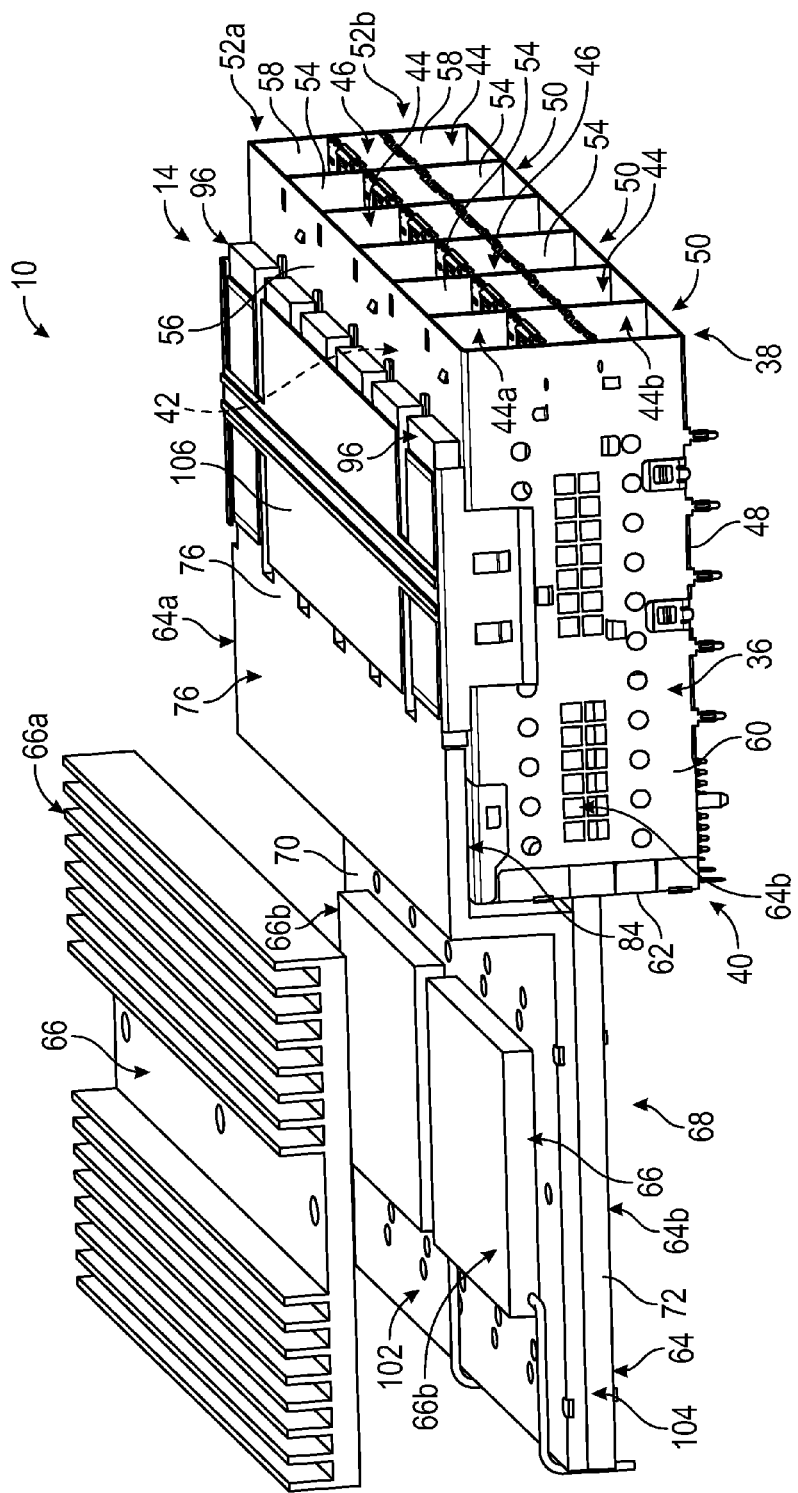
FIG. 2 is a partially exploded view of a portion of the transceiver assembly shown in FIG. 1.

FIG. 2 is a partially exploded view of a portion of the transceiver assembly 10. The pluggable modules 12 are not shown in FIG. 2 for clarity. Referring now to FIGS. 1 and 2, in general, the pluggable modules 12 and the receptacle assembly 14 may be used in any application requiring an interface between a host system and electrical and/or optical signals. Each pluggable module 12 interfaces to the host system through the receptacle assembly 14 via a corresponding receptacle connector 34 (shown in FIG. 5) of the receptacle assembly 14. The receptacle connector(s) 34 are located within an electrically conductive cage 36 (which is sometimes referred to as a "receptacle guide frame" or a "guide frame") of the receptacle assembly 14. The cage 36 extends from a front end 38 to a rear end 40 that is opposite the front end 38. The cage 36 includes an interior cavity 42 that is divided into two or more ports 44 by one or more dividers 46 and/or one or more sub-divider walls 54. The front end 38 of the cage 36 is open to the ports 44. The front end 38 of the cage 36 is configured to be mounted (i.e., received) within the opening in the panel. The receptacle connector(s) 34 extend within corresponding ports 44 at the rear end 40 of the cage 36. In the illustrated embodiment, the cage 36 is configured to be mounted to the host circuit board (not shown) along a lower wall 48 of the cage 36. The cage 36 includes one or more openings (not shown) that extend through the lower wall 48 for enabling the receptacle connector(s) 34 to electrically connect to the host circuit board from within the corresponding port 44. Each port 44 of the cage 36 is configured to receive a corresponding pluggable module 12 therein in electrical connection with the corresponding receptacle connector 34.

Although the cage 36 is shown as including twelve ports 44 in the illustrated embodiment, the cage 36 may include any number of ports 44. The ports 44 of the cage 36 may be arranged in any pattern, configuration, arrangement, and/or the like (such as, but not limited to, any number of rows and/or columns). In the illustrated embodiment, the receptacle assembly 14 includes twelve ports 44 that are arranged in six columns 50 and two rows 52a and 52b, wherein the columns 50 extend vertically (i.e., approximately perpendicular) relative to the plane of the host circuit board and the rows 52a and 52b extend horizontally (i.e., approximately parallel) to the plane of the host circuit board. The row 52a includes ports 44a, while the row 52b includes ports 44b. The ports 44b are arranged within the corresponding column 50 between the corresponding port 44a and the host circuit board in the illustrated embodiment.

In the illustrated embodiment, the dividers 46 divide the ports 44 into the rows 52a and 52b and sub-divider walls 54 divide each row 52a and 52b into the respective ports 44a and 44b. In other words, the sub-divider walls 54 divide the ports 44 into the columns 50 and the dividers 46 divide each column 50 into the ports 44a and 44b. In other embodiments, the sub-divider walls 54 may divide the ports 44 into the rows 52a and 52b with the dividers 46 dividing each row 52a and 52b into the respective ports 44a and 44b.

One example of another pattern, configuration, arrangement, and/or the like of the ports 44 is two ports arranged in a single column 50. Another example of another pattern, configuration, arrangement, and/or the like of the ports 44 is two ports arranged in a single row 52a or 52b. Each of the ports 44a and each of the ports 44b may be referred to herein as a "first port" and/or a "second port".

In the illustrated embodiment, the cage 36 includes an upper wall 56, the lower wall 48, and opposite side walls 58 and 60 that extend from the upper wall 56 to the lower wall 48. The cage 36 may also include a rear wall 62. The walls 48, 56, 58, 60, and 62 define boundaries of the interior cavity 42 of the cage 36. It should be understood that in other embodiments, the cage 36 may be mounted to the host circuit board along the side wall 58 or along the side wall 60. In such other embodiments, each of the side walls 58 and 60 may be considered an upper wall or a lower wall, the upper wall 56 may be considered a side wall, and the lower wall 48 may be considered a side wall. Although the cage 36 has the general shape of a parallelepiped in the illustrated embodiment, the cage 36 may additionally or alternatively include any other shape.

The receptacle assembly 14 includes a heat spreader 64 mounted to the cage 36. The heat spreader 64 is configured to thermally communicate with one or more heat exchangers 66 for dissipating heat from the pluggable modules 12 (shown in FIGS. 1 and 9) when the pluggable modules 12 are received within the ports 44 of the cage 36. In the illustrated embodiment, the heat spreader 64 includes an external heat spreader 64a and multiple internal heat spreaders 64b. The heat spreader 64 includes an extension 68 that in the illustrated embodiment is defined by an extension segment 70 of the external heat spreader 64a and one or more extension rails 72 of the internal heat spreader 64b. The extension 68 is configured to be engaged in thermal communication with the heat exchanger(s) 66. Optionally, the extension 68 is configured to hold one or more of the heat exchanger(s) 66. For example, in the illustrated embodiment the heat exchanger(s) 66 are mounted to the extension 68, as will be described below. The internal heat spreader 64b will be described in more detail below with reference to FIG. 4.

The transceiver assembly 10 may include any number of the heat exchangers 66. In other words, the extension 68 of the heat spreader 64 may be engaged in thermal communication with any number of heat exchangers 66. The heat spreader 64 may hold any number of the heat exchangers 66 of which the heat spreader 64 is engaged in thermal communication. Each heat exchanger 66 may be any type of heat exchanger, such as, but not limited to, a heat sink, a heat pipe, a thermal electric cooler, a radiator, a double pipe heat exchanger, a shell and tube heat exchanger, a plate heat exchanger, a plate and shell heat exchanger, an adiabatic wheel heat exchanger, a plate fin heat exchanger, a pillow plate heat exchanger, a fluid heat exchanger, a dynamic scraped surface heat exchanger, a phase-change heat exchanger, a direct contact heat exchanger, a spiral heat exchanger, and/or the like. In the illustrated embodiment, the transceiver assembly 10 includes three heat exchangers 66, namely a heat sink 66a and two thermal electric coolers (TECs) 66b (not visible in FIG. 1).

Figure 3:
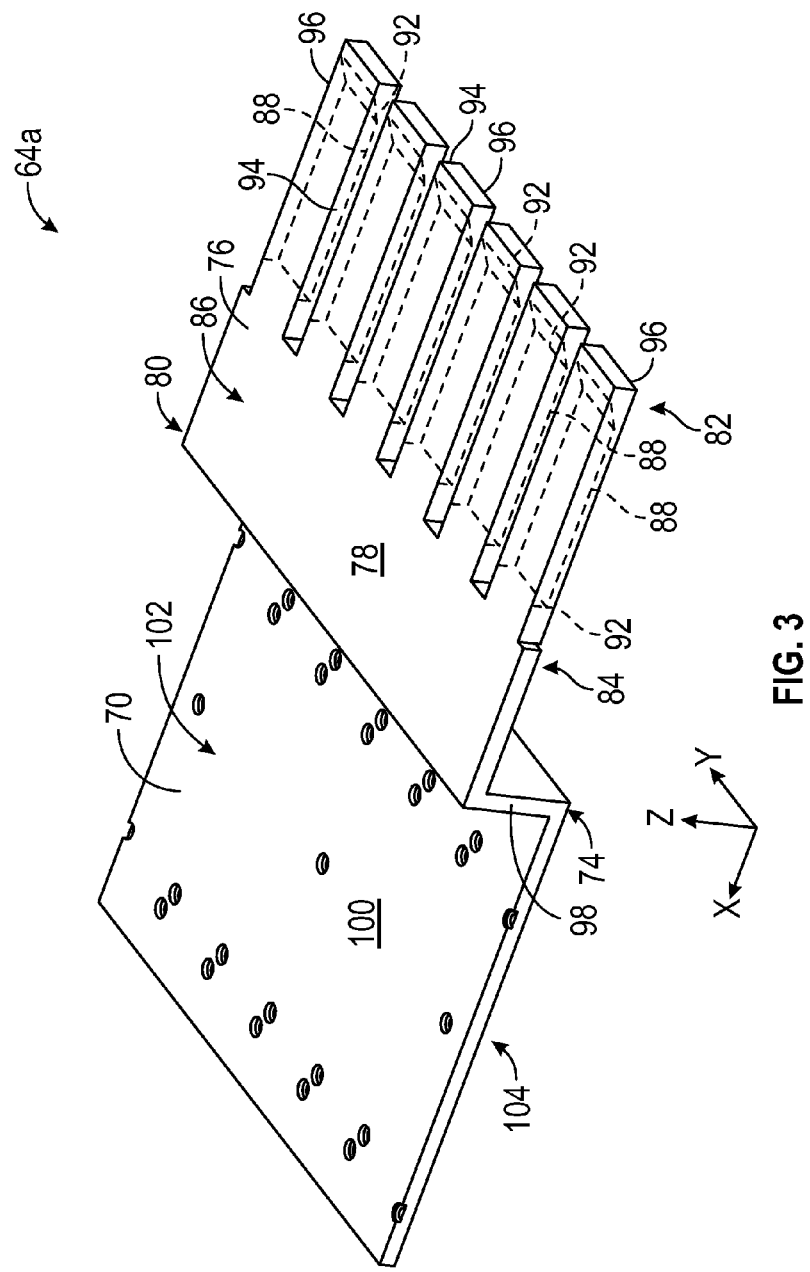
FIG. 3 is a perspective view of an embodiment of an external heat spreader of the transceiver assembly shown in FIGS. 1 and 2.

FIG. 3 is a perspective view of an embodiment of the external heat spreader 64a. The external heat spreader 64a includes a body 74 having a cage segment 76 and the extension segment 70. In the illustrated embodiment, the cage segment 76 is defined by a plate 78 that extends from an end 80 to an opposite end 82. The plate 78 of the cage segment 76 includes a module side 84 and an opposite side 86. As will be described below, the module side 84 of the cage segment 76 is configured to face the ports 44a (shown in FIGS. 1, 2, 5, 7, and 9) of the cage 36 (shown in FIGS. 1, 2, and 5-9) when the external heat spreader 64a is mounted to the cage 36.

Figure 9:
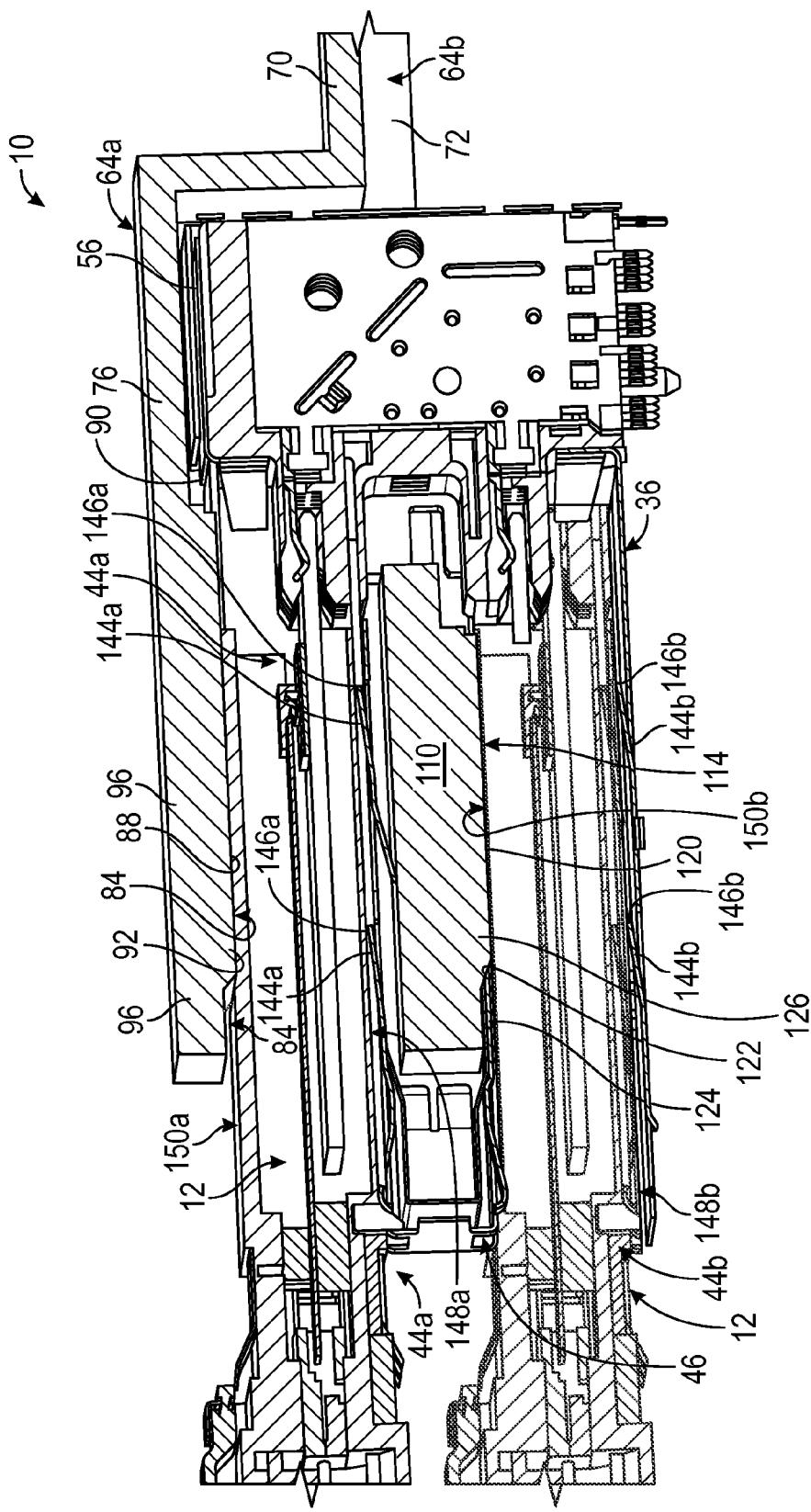
FIG. 9 is a partially broken-away perspective view of a portion of the transceiver assembly shown in FIGS. 1 and 2.

The module side 84 of the cage segment 76 includes module surfaces 88 at which the cage segment 76 is configured to be engaged in thermal communication with the corresponding pluggable module 12 (shown in FIGS. 1 and 9). Specifically, each module surface 88 is configured to be aligned with a corresponding opening 90 (shown in FIG. 9) within the upper wall 56 (shown in FIGS. 1, 2 6, and 9) of the cage 36 that exposes a corresponding port 44a. The module surface 88 is configured to engage in thermal communication with the corresponding pluggable module 12 via the corresponding opening 90 of the cage 36. Although six module surfaces 88 are shown in FIG. 3, the module side 84 of the cage segment 76 may include any number of the module surfaces 88, which may or may not be equal to the number of ports 44a. The module surface 88 is better seen in FIG. 9.

As used herein, two structures may be "engaged in thermal communication" by being engaged in physical contact with each other and/or by engaging in physical contact with one or more thermal interface members (not shown) that extend between the two structures.

Optionally, the module side 84 of the cage segment 76 includes platforms 92 that include the module surfaces 88. The platforms 92 are configured to extend into the corresponding opening 90 of the cage 36 to enable the corresponding module surface(s) 88 to engage in thermal communication with the corresponding pluggable module 12. Any other arrangement, configuration, and/or the like may be used in addition or alternative to the platforms 92 to enable the module surfaces 88 to engage in thermal communication with the corresponding pluggable module 12. The module side 84 of the cage segment 76 may include any number of the platforms 92, which may or may not be equal to the number of ports 44a. The platforms 92 are better seen in FIG. 9.

The plate 78 of the cage segment 76 optionally includes one or more openings 94 that define optional fingers 96 that extend along the cage segment 76 and include the end 82 of the cage segment 76. Each finger 96 includes one or more of the module surfaces 88. Each finger 96 is configured to be aligned with a corresponding port 44a to thereby align the module surface(s) 88 thereof with the corresponding opening 90 of the corresponding port 44a. The cage segment 76 may include any number of the fingers 96, which may or may not be equal to the number of ports 44a. Each finger 96 may include any number of the module surfaces 88 and any number of the platforms 92, which may or may not be the same number.

In the illustrated embodiment, the extension segment 70 is defined by a plate 98 that extends from the end 80 of the cage segment 76 and another plate 100 that extends outward from the plate 98 (and thus extends outward from the cage segment 76). The plate 100 of the extension segment 70 includes a side 102 and an opposite side 104. In the illustrated embodiment, the side 102 of the extension segment 70 is configured to be engaged in thermal communication with the heat exchanger(s) 66, while the side 104 is configured to be engaged in thermal communication with the extension rail(s) 72 of the internal heat spreader 64b, as will be described below. Each of the sides 102 and 104 may be referred to herein as a "first side" and/or a "second side".

The body 74 of the external heat spreader 64a is not limited to the geometry illustrated herein. Rather, the geometry of the body 74 of the external heat spreader 64a is meant as exemplary only. In addition or alternatively to the geometry illustrated herein, the body 74 of the external heat spreader 64a may have any other geometry that enables the external heat spreader 64a to function as described and/or illustrated herein. For example, the extension segment 70 may not include the plate 98 such that the plate 100 of the extension segment 70 and the plate 78 of the cage segment 76 form a continuous plate (i.e., such that the plate 100 is not offset along the z-axis from the plate 78). Moreover, and for example, the plate 98 may extend at another angle besides approximately perpendicular to the plates 100 and/or 70; and/or the plate 100 may extend another angle besides approximately parallel to the plate 78. The plate 100 may be offset from the plate 78 by any amount. In some embodiments, in addition or alternatively to the plates 78, 98, and/or 100, the body 74 of the external heat spreader 64a may be defined by one or more structures having a different geometry than a plate.

The body 74 of the external heat spreader 64a includes one or more relatively high thermally conductive materials such that the external heat spreader 64a is configured to transfer heat between the cage segment 76 and the extension segment 70. For example, segments, a majority, and/or an approximate entirety of the body 74 of the external heat spreader 64a may have a thermal conductivity of at least approximately 5.0 Btu/(hr-ft-F). The one or more relatively high thermally conductive materials of the body 74 may include any material, such as, but not limited to, a metal, a composite material, silver, copper, gold, aluminum, brass, yellow brass, cast-iron, stainless steel, and/or the like.

Referring again to FIG. 2, the cage segment 76 of the external heat spreader 64a is mounted to the cage 36 such that the cage segment 76 extends over at least a portion of the cage 36. Specifically, the cage segment 76 extends over a portion of the upper wall 56 of the cage in the illustrated embodiment. As can be seen in FIG. 2, the module side 84 of the cage segment 76 faces the ports 44a of the cage 36. Each finger 96 of the cage segment 76 is aligned with a corresponding port 44a such that the platforms 92 (not visible in FIG. 2; shown in FIG. 9) and module surfaces 88 (not visible in FIG. 2; shown in FIG. 9) are aligned with the corresponding openings 90 (not visible in FIG. 2; shown in FIG. 9) of the corresponding ports 44a. The platforms 92 extend into the corresponding openings 90.

In the illustrated embodiment, one or more spring clips 106 extend over the cage segment 76 and interlock with the cage 36 to retain the external heat spreader 64a to the cage 36 (i.e., to hold the external heat spreader 64a mounted to the cage). In addition or alternatively to the spring clip 106, the external heat spreader 64a may be mounted to the cage 36 using any other suitable structure. The spring clip 106 and/or other structure(s) may press (i.e., bias) the fingers 96 against the upper wall 56 of the cage 36, for example to facilitate extending the platforms 92 into the corresponding openings 90, to facilitate engagement in thermal communication between the fingers 96 and the corresponding pluggable modules 12, and/or the like.

The extension segment 70 of the external heat spreader 64a extends from the cage segment 76 in a direction generally away from the cage 36, as can be seen in FIG. 2. Although the extension segment 70 extends in a direction generally away from the rear wall 62 of the cage 36 in the illustrated embodiment, the extension segment 70 may additionally or alternatively extend in any other direction away from the cage 36 (e.g., in a direction generally away from the upper wall 56, the side wall 58, and/or the side wall 60).

As should be apparent from the partially exploded view of FIG. 2, the side 102 of the extension segment 70 is engaged in thermal communication with the heat exchangers 66a and 66b. In the illustrated embodiment, the heat exchangers 66a and 66b are mounted to the side 102 of the extension segment 70 such that the extension segment 70 holds the heat exchangers 66a and 66b on the side 102. Optionally, the side 104 of the extension segment 70 is engaged in thermal communication with one or more heat exchangers (not shown). Moreover, the side 104 of the extension segment 70 optionally holds one or more of the one or more heat exchangers on the side 104.

Figure 4:
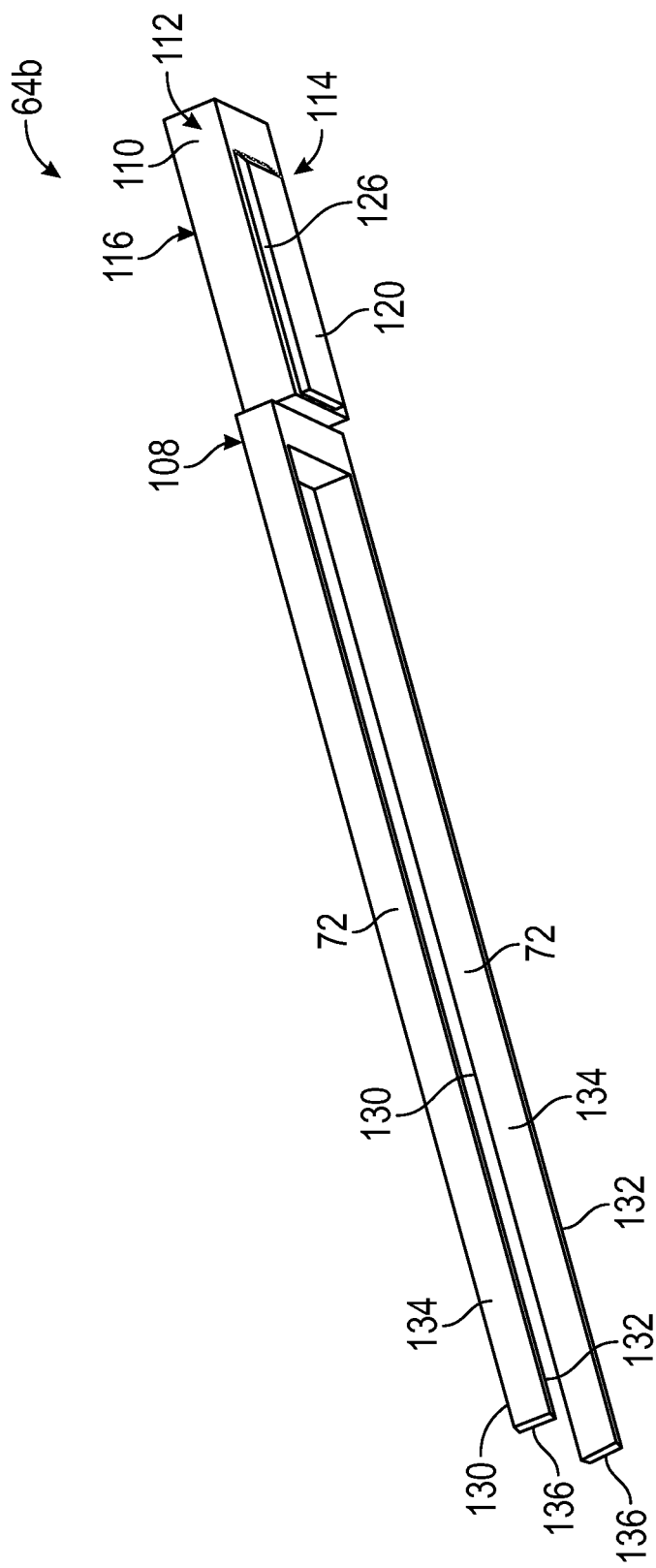
FIG. 4 is a perspective view of an embodiment of an internal heat spreader of the transceiver assembly shown in FIGS. 1 and 2.

FIG. 4 is a perspective view of an embodiment of the internal heat spreader 64b. The internal heat spreader 64b includes a body 108 having a divider segment 110 and the one or more extension rails 72. In the illustrated embodiment, the divider segment 110 is defined by a plate 112 that includes a module side 114 and an opposite side 116. As will be described below, the divider segment 110 is configured to extend within an internal compartment 118 (FIG. 5) of a corresponding divider 46 (FIGS. 1, 2, 5, 7, and 9) with the module side 114 of the divider segment 110 facing the corresponding port 44b (shown in FIGS. 1, 2, 5, 8, and 9) of the cage 36 (shown in FIGS. 1, 2, and 5-9).

The module side 114 of the divider segment 110 includes a module surface 120 at which the divider segment 110 is configured to be engaged in thermal communication with the corresponding pluggable module 12 (shown in FIGS. 1 and 9). Specifically, each module surface 120 is configured to be aligned with a corresponding opening 122 (shown in FIG. 9) within a wall 124 (shown in FIGS. 5 and 9) of the corresponding divider 46. The opening 122 exposes the corresponding port 44b to the internal compartment 118 of the corresponding divider 46. The module surface 120 is configured to engage in thermal communication with the corresponding pluggable module 12 via the corresponding opening 122 of the corresponding divider 46. Although one is shown, the module side 114 of the divider segment 110 may include any number of the module surfaces 120.

Optionally, the module side 114 of the divider segment 110 includes a platform 126 that includes the module surface 120. The platform 126 is configured to extend into the corresponding opening 122 of the corresponding divider 46 to enable the module surface 120 to engage in thermal communication with the corresponding pluggable module 12. Any other arrangement, configuration, and/or the like may be used in addition or alternative to the platform 126 to enable the module surface 120 to engage in thermal communication with the corresponding pluggable module 12. The module side 114 of the divider segment 110 may include any number of the platforms 126. Each platform 126 may include any number of the module surfaces 120.

The extension rails 72 extend outward from the divider segment 110. Each extension rail 72 includes opposite sides 130 and 132 and opposite sides 134 and 136. In the illustrated embodiment, the side 130 of each extension rail 72 is configured to be engaged in thermal communication with the side 104 (shown in FIGS. 2, 3, and 6) of the extension segment 70 (shown in FIGS. 1-3, 6, and 9) of the external heat spreader 64a (shown in FIGS. 1-3, 5-7, and 9). The body 108 of the internal heat spreader 64b may include any number of the extension rails 72.

The body 108 of the internal heat spreader 64b is not limited to the geometry illustrated herein. Rather, the illustrated geometry of the body 108 is meant as exemplary only. In addition or alternatively to the geometry illustrated herein, the body 108 of the internal heat spreader 64b may have any other geometry that enables the internal heat spreader 64b to function as described and/or illustrated herein. For example, the body 108 may include one or more plates (not shown) that extend outward from the divider segment 110 in addition or alternatively to one or more of the extension rails 72. Moreover, and for example, although shown as extending approximately parallel to the divider segment 110, each extension rail 72 may extend outward from the divider segment 110 at any other angle relative to the divider segment 110. In some embodiments, in addition or alternatively to the plate 112, the divider segment 110 of the internal heat spreader 64b is defined by one or more structures having a different geometry than a plate.

The body 108 of the internal heat spreader 64b includes one or more relatively high thermally conductive materials such that the internal heat spreader 64b is configured to transfer heat between the divider segment 110 and the extension rails 72. For example, segments, a majority, and/or an approximate entirety of the body 108 of the internal heat spreader 64b may have a thermal conductivity of at least approximately 5.0 Btu/(hr-ft-F). The one or more relatively high thermally conductive materials of the body 108 may include any material, such as, but not limited to, a metal, a composite material, silver, copper, gold, aluminum, brass, yellow brass, cast-iron, stainless steel, and/or the like.

Figure 5:
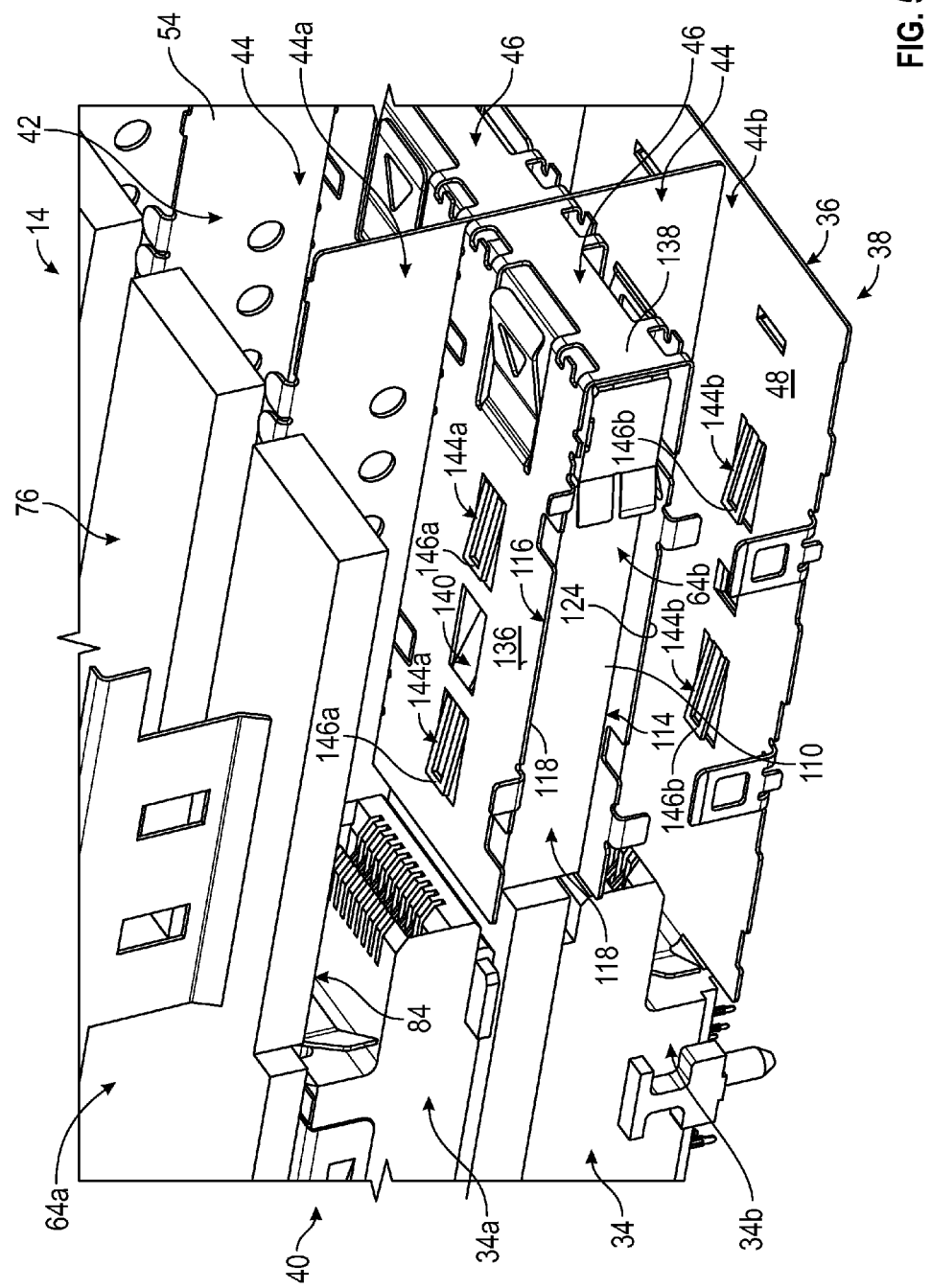
FIG. 5 is a partially broken-away perspective view of a portion of an embodiment of a receptacle assembly of the transceiver assembly shown in FIGS. 1 and 2.

FIG. 5 is a partially broken-away perspective view of a portion of an embodiment of the receptacle assembly 14. The upper wall 56 (shown in FIGS. 1, 2, 6, and 9) and the side wall 60 (shown in FIGS. 1, 2, and 6) of the cage 36 have been removed from FIG. 5 to better illustrate the interior cavity 42 of the cage 36.

Each divider 46 includes the wall 124, a wall 136 that extends opposite the wall 124, and a front wall 138 that extends from the wall 124 to the wall 136 at the front end 38 of the cage 36. The walls 124 and 136 are spaced apart from each other to define the internal compartment 118 of the divider 46 therebetween. As can be seen in FIG. 5, the internal compartment 118 of the divider 46 extends between the corresponding ports 44a and 44b. The wall 136 defines a boundary of the corresponding port 44a and defines a division between the corresponding port 44a and the internal compartment 118 of the divider 46. The wall 124 defines a boundary of the corresponding port 44b and defines a division between the corresponding port 44b and the internal compartment 118 of the divider 46. The side wall 60 (FIG. 2) of the cage 36 defines a boundary of the internal compartment 118, while the corresponding sub-divider wall 54 defines an opposite boundary of the internal compartment 118. Optionally, the wall 124 of the divider 46 includes the opening 122 (shown in FIG. 9) that extends through the wall 124. As will be described below, the opening 122 facilitates engagement in thermal communication between the divider segment 110 of the internal heat spreader 64b and the corresponding pluggable module 12 (shown in FIGS. 1 and 9).

As will be described below, the internal compartment 118 of the divider 46 is configured to hold a portion of the internal heat spreader 64b. The internal compartment 118 of the divider 46 is optionally configured to hold one or more components, such as, but not limited to, an electrical component, an optical component, an indicator light, a status light, and/or the like. Optionally, the front wall 138 includes one or more windows (not shown) for exposing one or more of the components held within the internal compartment 118, for example for enabling an indicator and/or status light to be visible through the front wall 138.

The structure and geometry of the other dividers 46 of the illustrated embodiment of the cage 36 are substantially similar to the divider 46 shown and described with respect to FIG. 5 and therefore the structure and geometry of the other dividers 46 will not be described in more detail herein.

FIG. 5 illustrates the receptacle connectors 34, which extend within each port 44 at the rear end 40 of the cage 36. Specifically, the ports 44a and 44b include respective receptacle connectors 34a and 34b that are held therein at the rear end 40 of the cage 36. The receptacle connectors 34a and 34b may be discrete components independent from each other or may be mechanically and/or electrically connected together (e.g., contained within the same housing, defining continuous electrical pathways therethrough, and/or the like).

As illustrated in FIG. 5, the divider segment 110 of the internal heat spreader 64b extends within the internal compartment 118 of the corresponding divider 46. The module side 114 of the divider segment 110 faces the corresponding port 44b. The divider segment 110 is held in the internal compartment 118 such that the platforms 126 (not visible in FIG. 5; shown in FIGS. 4 and 9) and the module surface 120 (not visible in FIG. 5; shown in FIGS. 4 and 9) are aligned with the opening 122 (not visible in FIG. 5; shown in FIG. 9) of the wall 124 of the corresponding divider 46. The platform 126 extends into the opening 122. Extension of the platform 126 within the corresponding opening 122 is better seen in FIG. 9.

The cage 36 includes an optional spring 140 that engages in physical contact with the side 116 of the divider segment 110. The spring 140 may press (i.e., bias) the divider segment 110 against the wall 124 of the corresponding divider 46, for example to facilitate extending the platform 126 into the opening 122, to facilitate engagement in thermal communication between the divider segment 110 and the corresponding pluggable module 12 (shown in FIGS. 1 and 9), and/or the like. The spring 140 may facilitate retaining (i.e., holding) the divider segment 110 within the internal compartment 118 of the corresponding divider 46.

Although shown as being formed as a single, unitary structure with the wall 136 of the corresponding divider 46 of the cage 36, alternatively the spring 140 is a discrete structure from the cage 36 (e.g., from the wall 136 of the divider) that is operatively connected with the cage 36 (e.g., with the wall 136) and the divider segment 110 (e.g., with the side 116) to press the divider segment 110 against the wall 124 of the corresponding divider 46 and/or to facilitate retaining the divider segment 110 within the internal compartment 118. The spring 140 is not limited to the type of spring 140 or the particular geometry of the spring 140 as shown herein. Rather, the spring 140 as shown herein is meant as exemplary only. In addition or alternatively to the spring 140, the cage 36 may include any other type of spring, and/or one or more springs having any other geometry, that is configured to press the divider segment 110 against the wall 124 of the corresponding divider 46 and/or to facilitate retaining the divider segment 110 within the internal compartment 118, such as, but not limited to, a helical (i.e., coil) spring, a leaf spring, and/or the like. Other arrangements, configurations, structures, and/or the like may be used in addition or alternatively to a spring and/or in addition or alternatively to the particular spring 140 to press the divider segment 110 against the wall 124 of the corresponding divider 46 and/or to facilitate retaining the divider segment 110 within the internal compartment 118.

Figure 6:
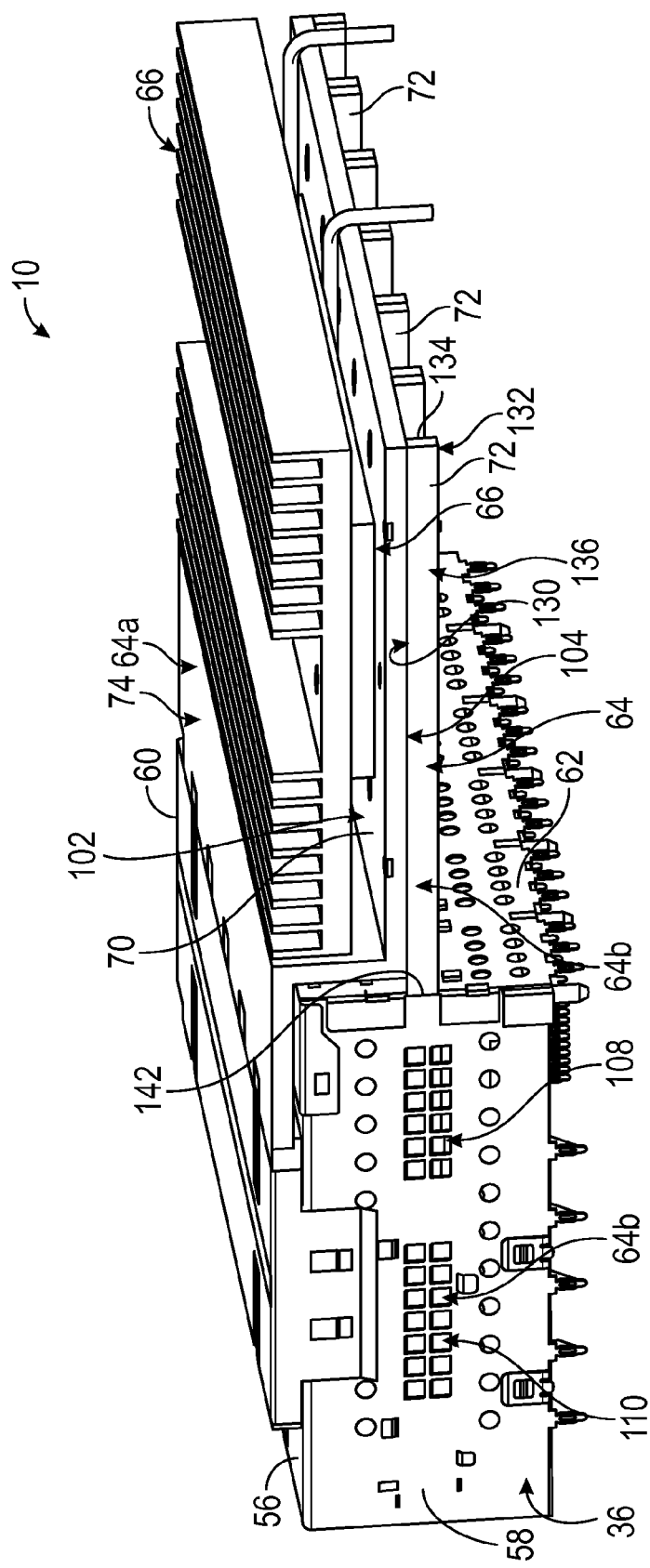
FIG. 6 is another perspective view of the transceiver assembly shown in FIGS. 1 and 2 in a different orientation.

FIG. 6 is another perspective view of the transceiver assembly 10 illustrating the extension rails 72 of the internal heat spreader 64b. The extension rails 72 of the internal heat spreader 64b extend outward from the divider segment 110 and through the rear wall 62 of the cage 36 in a direction generally away from the cage 36. Each extension rail 72 extends through a corresponding opening 142 that extends through the rear wall 62 of the cage 36. Although the extension rails 72 extend in a direction generally away from the rear wall 62 of the cage 36 in the illustrated embodiment, the extension rails 72 may additionally or alternatively extend in any other direction away from the cage 36 (e.g., in a direction generally away from the upper wall 56, the side wall 58, and/or the side wall 60).

In the illustrated embodiment, the side 130 of each extension rail 72 is engaged in thermal communication with the side 104 of the extension segment 70 of the external heat spreader 64a. The extension rails 72 are thus in thermal communication with the heat exchangers 66 through the extension segment 70 of the external heat spreader 64a in the illustrated embodiment. In addition or alternatively, one or more of the extension rails 72 is engaged in thermal communication directly with one or more of the heat exchangers 66 (e.g., in embodiments wherein the heat spreader 64 does not include the external heat spreader 64a or in embodiments wherein the extension rails 72 extend between the heat exchangers 66 and the extension segment 70 of the external heat spreader 64a). In addition or alternatively to being engaged in thermal communication with the side 104 of the extension segment 70, one or more of the extension rails 72 may be engaged in thermal communication with the side 102 of the extension segment 70. Moreover, in addition or alternatively to being engaged in thermal communication with the extension segment 70 at the side 130, one or more extension rails 72 may be engaged in thermal communication with the extension segment 70 at the side 132, the side 134, and/or the side 136.

As should be apparent from FIG. 6, in the illustrated embodiment the heat spreader 64 includes a plurality of the internal heat spreaders 64b, each of which includes a discrete body 108 that includes a single divider segment 110 and one or more of the extension rails 72. The heat spreader 64 may include any number of the internal heat spreaders 64b, which may or may not be the same as the number of dividers 46 (shown in FIGS. 1, 2, 5, 7, and 9). In some other embodiments, two or more of the divider segments 110 and the associated extension rail(s) 72 thereof are formed as a single, unitary body 108. The heat spreader 64 may include any number of the extension rails 72 overall.

In some embodiments, the heat spreader 64 does not include the external heat spreader 64a. In other embodiments, the heat spreader 64 does not include the internal heat spreader 64b. Moreover, although shown as having discrete (i.e., separate) bodies 74 and 108, the external heat spreader 64a may be formed as a single, unitary body 74 with the body 108 of one or more of the internal heat spreaders 64b.

Referring again to FIG. 5, each port 44a of the cage 36 includes one or more springs 144a configured to engage in physical contact with the corresponding pluggable module 12 (shown in FIGS. 1 and 9) when the corresponding pluggable module 12 is received within the port 44a. As will be described below, each spring 144a is configured to press the corresponding pluggable module 12 in thermal communication with the module side 84 of the cage segment 76 of the external heat spreader 64a.

In the illustrated embodiment, each spring 144a extends from the wall 136 of the corresponding divider 46 to an end 146a that extends within the corresponding port 44a. As will be described below, the end 146a is configured to engage in physical contact with the corresponding pluggable module 12 to press the corresponding pluggable module 12 in thermal communication with the module side 84 of the cage segment 76 of the external heat spreader 64a. Although two are shown, each port 44a may include any number of the springs 144a. Each spring 144a may be referred to herein as a "first spring" and/or a "second spring".

The illustrated embodiment of each spring 144a is formed as a single, unitary structure with the wall 136 of the corresponding divider 46. But, alternatively one or more of the springs 144a is a discrete structure from the cage 36 (e.g., from the wall 136 of the corresponding divider 46) that is operatively connected with the cage 36 (e.g., with the wall 136) to press the corresponding pluggable module 12 in thermal communication with the module side 84 of the cage segment 76 of the external heat spreader 64a.

Moreover, each spring 144a is not limited to the type of spring 144a or the particular geometry of the spring 144a as shown herein. Rather, each spring 144a as shown herein is meant as exemplary only. In addition or alternatively to the springs 144a, the cage 36 may include any other type of spring, and/or one or more springs having any other geometry, that is configured to press the corresponding pluggable module 12 in thermal communication with the cage segment 76, such as, but not limited to, a helical (i.e., coil) spring, a leaf spring, and/or the like. Other arrangements, configurations, structures, and/or the like may be used in addition or alternatively to a spring and/or in addition or alternatively to the particular spring 144a to press the corresponding pluggable module 12 in thermal communication with the cage segment 76.

Each port 44b of the cage 36 includes one or more springs 144b configured to engage in physical contact with the corresponding pluggable module 12 when the corresponding pluggable module 12 is received within the port 44b. Each spring 144b is configured to press the corresponding pluggable module 12 in thermal communication with the module side 114 of the divider segment 110 of the corresponding internal heat spreader 64b.

Each spring 144b of the illustrated embodiment extends from the lower wall 48 of the cage 36 to an end 146b that extends within the corresponding port 44b. The end 146b is configured to engage in physical contact with the corresponding pluggable module 12 to press the corresponding pluggable module 12 in thermal communication with the module side 114 of the corresponding divider segment 110. In the illustrated embodiment, each port 44b includes two of the springs 144b. But, each port 44b may include any number of the springs 144b. Each spring 144b may be referred to herein as a "first spring" and/or a "second spring".

In the illustrated embodiment, each spring 144b is formed as a single, unitary structure with the lower wall 48 of the cage 36. Alternatively, one or more of the springs 144b is a discrete structure from the cage 36 (e.g., from the lower wall 48 of the cage 36) that is operatively connected with the cage 36 (e.g., with the lower wall 48) to press the corresponding pluggable module 12 in thermal communication with the module side 110 of the divider segment 110 of the corresponding internal heat spreader 64b.

Each spring 144b is not limited to the type of spring 144b or the particular geometry of the spring 144b as shown herein. Rather, each spring 144b as shown herein is meant as exemplary only. In addition or alternatively to the springs 144b, the cage 36 may include any other type of spring, and/or one or more springs having any other geometry, that is configured to press the corresponding pluggable module 12 in thermal communication with the corresponding divider segment 110, such as, but not limited to, a helical (i.e., coil) spring, a leaf spring, and/or the like. Other arrangements, configurations, structures, and/or the like may be used in addition or alternatively to a spring and/or in addition or alternatively to the particular spring 144b to press the corresponding pluggable module 12 in thermal communication with the corresponding divider segment 110.

Figure 7:
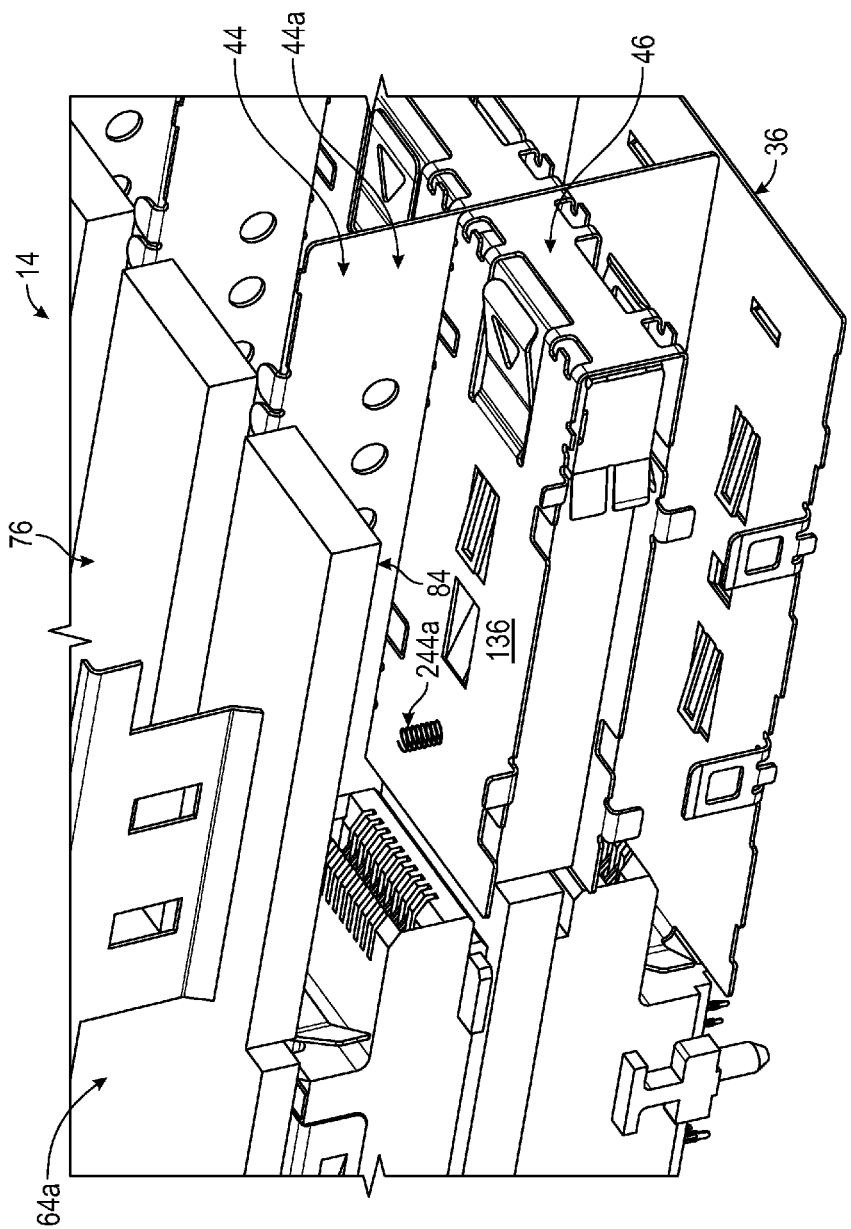
FIG. 7 is a partially broken-away perspective view of a portion of the receptacle assembly illustrating another embodiment of a spring.

FIG. 7 is a partially broken-away perspective view of a portion of the receptacle assembly 14 illustrating an alternative embodiment of a spring 244a that is configured press the corresponding pluggable module 12 (shown in FIGS. 1 and 9) in thermal communication with the module side 84 of the cage segment 76 of the external heat spreader 64a. In the embodiment of FIG. 7, the spring 244a is a helical spring that is a discrete structure from the cage 36. For example, the spring 244a is a discrete structure from the wall 136 of the corresponding divider 46. The spring 244a is operatively connected with the wall 136 of the corresponding divider 46 such that the spring 244a is configured to engage in physical contact with the corresponding pluggable module 12 when the corresponding pluggable module 12 is received within the corresponding port 44a. The spring 244a is thereby configured to press the corresponding pluggable module 12 in thermal communication with the module side 84 of the cage segment 76.

Figure 8:
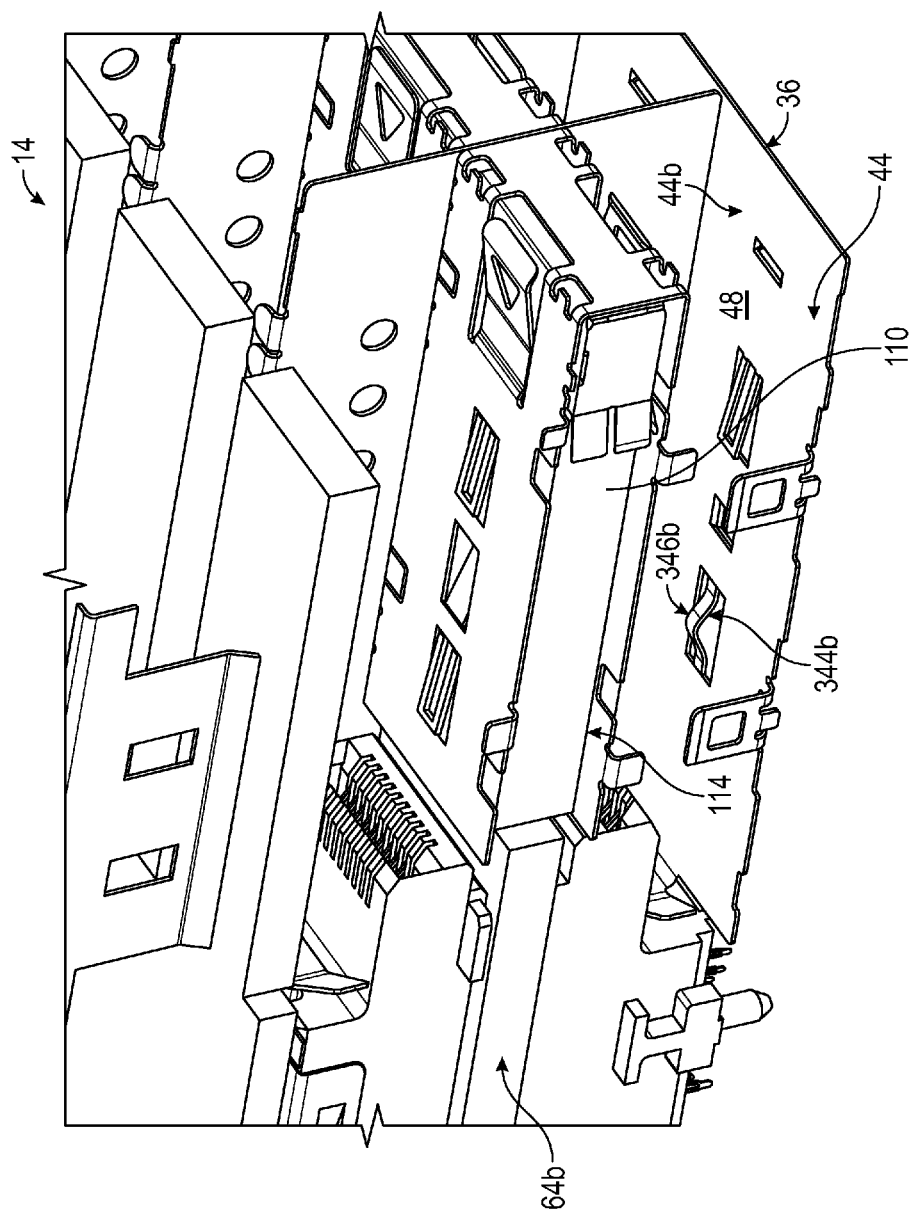
FIG. 8 is another partially broken-away perspective view of a portion of the receptacle assembly illustrating another embodiment of a spring.

FIG. 8 is a partially broken-away perspective view of a portion of the receptacle assembly 14 illustrating an alternative embodiment of a spring 344b that is configured press the corresponding pluggable module 12 (shown in FIGS. 1 and 9) in thermal communication with the module side 114 of the divider segment 110 of the corresponding internal heat spreader 64b. In the embodiment of FIG. 8, the spring 344b is formed as a single, unitary structure with the cage 36. For example, the spring 344b is formed as a single, unitary structure with the lower wall 48 of the cage 36.

The spring 344b extends from the lower wall 48 of the cage 36 to an end 346b that extends within the corresponding port 44b. The end 346b is configured to engage in physical contact with the corresponding pluggable module 12 when the corresponding pluggable module 12 is received within the corresponding port 44b to press the corresponding pluggable module 12 in thermal communication with the corresponding divider segment 110.

FIG. 9 is a partially broken-away perspective view of a portion of the transceiver assembly 10. As shown in FIG. 9, the module side 84 of the cage segment 76 faces the ports 44a of the cage 36. Each finger 96 of the cage segment 76 is aligned with a corresponding port 44a such that the platforms 92 and module surfaces 88 are aligned with the corresponding openings 90 of the corresponding ports 44a. The platforms 92 extend into the corresponding openings 90.

As can be seen in FIG. 9, a pluggable module 12 is received within the illustrated port 44a. Each spring 144a is engaged in physical contact with the corresponding pluggable module 12 received within the illustrated port 44a. Specifically, in the illustrated embodiment, the end 146a of each spring 144a is engaged in physical contact with a spring side 148a of the corresponding pluggable module 12. The engagement in physical contact and the natural bias of each spring 144a causes each spring 144a to press the pluggable module 12 in thermal communication with the module side 84 of the cage segment 76 of the external heat spreader 64a. Specifically, the springs 144a press a spreader side 150a of the corresponding pluggable module 12 in thermal communication with the module surface 88 of the module side 84 of the cage segment 76 of the external heat spreader 64a. Accordingly, the spreader side 150a of the corresponding pluggable module 12 is engaged in thermal communication with the module surface 88 of the module side 84 of the cage segment 76 of the external heat spreader 64a.

The thermal communication between the cage segment 76 of the external heat spreader 64a and the pluggable module 12 received within the illustrated port 44a causes the cage segment 76 to absorb heat from the pluggable module 12 during operation of the pluggable module 12. The external heat spreader 64a transfers the heat absorbed from the pluggable module 12 received within the illustrated port 44a to the extension segment 70 and ultimately to the heat exchangers 66 (shown in FIGS. 1, 2, and 6) for dissipation to the environment and/or another medium, structure, and/or the like.

The pluggable module 12 received within the illustrated port 44a may be engaged in thermal communication (i.e., pressed in thermal communication) with the module side 84 of the cage segment 76 of the external heat spreader 64a via physical contact between the spreader side 150a of the pluggable module 12 and the module surface 88 of the module side 84 of the cage segment 76. In addition or alternatively, the pluggable module 12 received within the illustrated port 44a may be engaged in thermal communication (i.e., pressed in thermal communication) with the module side 84 of the cage segment 76 of the external heat spreader 64a via engagement of the spreader side 150a in physical contact with one or more thermal interface members (not shown) that extend between the spreader side 150a and the module surface 88. In some embodiments, the thermal interface member is at least partially defined by the upper wall 56 of the cage 36, with the spreader side 150a of the pluggable module 12 and the module surface 88 of external heat spreader 64a being engaged in physical contact with opposite sides of the upper wall 56 of the cage 36. In such embodiments wherein the thermal interface member is at least partially defined by the upper wall 56 of the cage 36, the cage segment 76 of the external heat spreader 64a absorbs heat from the upper wall 56 that has been absorbed from the pluggable module 12 received within the illustrated port 44a by the upper wall 56. In such embodiments wherein the thermal interface member is at least partially defined by the upper wall 56 of the cage 36, the wall 56 may or may not include one or more of the openings 90.

Referring now to the illustrated port 44b, the module side 114 of the divider segment 110 of the internal heat spreader 64b faces the corresponding port 44b of the cage 36. The platform 126 and the module surface 120 are aligned with the opening 122 of the wall 124 of the corresponding divider 46. As can be seen in FIG. 9, the platform 126 extends into the corresponding opening 122.

As can be seen in FIG. 9, a pluggable module 12 is received within the illustrated port 44b. Each spring 144b is engaged in physical contact with the corresponding pluggable module 12 received within the illustrated port 44b. Specifically, in the illustrated embodiment, the end 146b of each spring 144b is engaged in physical contact with a spring side 148b of the corresponding pluggable module 12. The engagement in physical contact and the natural bias of each spring 144b causes each spring 144b to press the pluggable module 12 in thermal communication with the module side 114 of the divider segment 110 of the internal heat spreader 64*b*. Specifically, the springs 144*b* press a spreader side 150*b* of the corresponding pluggable module 12 in thermal communication with the module surface 120 of the module side 114 of the divider segment 110 of the internal heat spreader 64*b*. Accordingly, the spreader side 150*b* of the corresponding pluggable module 12 is engaged in thermal communication with the module surface 120 of the module side 114 of the divider segment 110 of the internal heat spreader 64*b*.

The thermal communication between the divider segment 110 of the internal heat spreader 64*b* and the pluggable module 12 received within the illustrated port 44*b* causes the divider segment 110 to absorb heat from the pluggable module 12 during operation of the pluggable module 12. The internal heat spreader 64*b* transfers the heat absorbed from the pluggable module 12 received within the illustrated port 44*b* to the extension rails 72 and ultimately to the heat exchangers 66 (FIG. 2) for dissipation to the environment and/or another medium, structure, and/or the like.

The pluggable module 12 received within the illustrated port 44*b* may be engaged in thermal communication (i.e., pressed in thermal communication) with the module side 114 of the divider segment 110 of the internal heat spreader 64*b* via physical contact between the spreader side 150*b* of the pluggable module 12 and the module surface 120 of the module side 114 of the divider segment 110. In addition or alternatively, the pluggable module 12 received within the illustrated port 44*b* may be engaged in thermal communication (i.e., pressed in thermal communication) with the module side 114 of the divider segment 110 of the internal heat spreader 64*b* via engagement of the spreader side 150*b* in physical contact with one or more thermal interface members (not shown) that extend between the spreader side 150*b* and the module surface 120.

In some embodiments, the thermal interface member is at least partially defined by the wall 124 of the divider 46, with the spreader side 150*b* of the pluggable module 12 and the module surface 120 of internal heat spreader 64*b* being engaged in physical contact with opposite sides of the wall 124. In such embodiments wherein the thermal interface member is defined at least partially by the wall 124 of the divider 46, the divider segment 110 of the internal heat spreader 64*b* absorbs heat from the wall 124 that has been absorbed from the pluggable module 12 received within the illustrated port 44*b* by the wall 124. In such embodiments wherein the thermal interface member is at least partially defined by the wall 124 of the divider 46, the wall 124 may or may not include the corresponding opening(s) 122.

The embodiments described and/or illustrated herein may provide a transceiver assembly that facilitates preventing one or more pluggable modules of the transceiver assembly from overheating.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A receptacle assembly comprising:
a cage comprising an interior cavity having a port, the cage comprising a rear end and a front end, the front end is open to the port, the port being configured to receive a pluggable module therein through the front end of the cage, the cage comprising a spring; and
a heat spreader comprising a body having a cage segment that is configured to be mounted to the cage such that the cage segment extends over at least a portion of the cage with a module side of the cage segment facing the port, the body comprising an extension segment that extends from the cage segment, the extension segment being positioned behind the rear end and extending in a direction generally away from the cage, the extension segment having a first side that is engaged in thermal communication with a heat exchanger behind the rear end, wherein the spring is configured to engage the pluggable module when the pluggable module is received within the port such that the spring is configured to press the pluggable module in thermal communication with the module side of the cage segment of the heat spreader.

2. The receptacle assembly of claim 1, wherein the port is a first port, the spring is a first spring, and the pluggable module is a first pluggable module, the cage comprising a divider that divides the interior cavity into the first port and a second port, the second port being configured to receive a second pluggable module therein, the divider comprising an internal compartment that extends between the first and second ports, the heat spreader comprising a divider segment that is configured to extend within the internal compartment of the divider, wherein the cage comprises a second spring that is configured to engage the second pluggable module when the second pluggable module is received within the second port such that the second spring is configured to press the second pluggable module in thermal communication with the divider segment of the heat spreader.

3. The receptacle assembly of claim 1, wherein the port is a first port and the pluggable module is a first pluggable module, the cage comprising a divider that divides the interior cavity into the first port and a second port, the second port being configured to receive a second pluggable module therein, the divider comprising an internal compartment that extends between the first and second ports, the heat spreader comprising a divider segment that is configured to extend within the internal compartment of the divider such that the divider segment is configured to be engaged in thermal communication with the second pluggable module when the second pluggable module is received within the second port, wherein the heat spreader further comprises at least one extension rail that extends outward from the divider segment and through a wall of the cage in a direction generally away from the cage.

4. The receptacle assembly of claim 1, wherein the port is a first port and the pluggable module is a first pluggable module, the cage comprising a divider that divides the interior cavity into the first port and a second port, the second port being configured to receive a second pluggable module therein, the divider comprising an internal compartment that extends between the first and second ports, the heat spreader comprising a divider segment that is configured to extend within the internal compartment of the divider such that the divider segment is configured to be engaged in thermal communication with the second pluggable module when the second pluggable module is received within the second port, the heat spreader further comprising at least one extension rail that extends outward from the divider segment, wherein the at least one extension rail is configured to be engaged in thermal communication with the extension segment of the heat spreader.

5. The receptacle assembly of claim 4, wherein the extension segment of the heat spreader is configured to be engaged in thermal communication with the heat exchanger on a first side of the extension segment and the extension segment is configured to be engaged in thermal communication with the at least one extension rail on a second side of the extension segment that is opposite the first side.

6. The receptacle assembly of claim 1, wherein the spring is formed as a single, unitary structure with a wall of the cage that defines the port.

7. The receptacle assembly of claim 1, wherein the spring is a discrete structure from the cage that is operatively connected with a wall of the cage that defines the port such that the spring is configured to engage the pluggable module when the pluggable module is received within the port.

8. The receptacle assembly of claim 1, wherein the spring comprises an end that extends within the port, the end being configured to engage the pluggable module to press the pluggable module in thermal communication with the module side of the cage segment of the heat spreader.

9. The receptacle assembly of claim 1, wherein a spreader side of the pluggable module is configured to be engaged in thermal communication with the module side of the cage segment of the heat spreader, the spring being configured to engage a spring side of the pluggable module that is opposite the spreader side.

10. The receptacle assembly of claim 1, wherein the cage segment and the extension segment of the heat spreader comprise plates.

11. The receptacle assembly of claim 1, wherein the cage comprises an opening that exposes the port, the module side of the cage segment of the heat spreader comprising a platform that is configured to extend into the opening of the cage, the platform having a module surface at which the cage segment is configured to be engaged in thermal communication with the pluggable module.

12. A receptacle assembly comprising:
a cage comprising an interior cavity and a divider that divides the interior cavity into first and second ports, the cage having a front end and a rear end, the front end is open to the first and second ports, the first and second ports configured to receive first and second pluggable modules, respectively, therein through the front end, the divider comprising an internal compartment that extends between the first and second ports, the cage comprising a first and second spring; and
an internal heat spreader configured to be mounted to the cage, the internal heat spreader comprising a divider segment that is configured to extend within the internal compartment of the divider with a module side of the divider segment facing the first port, the internal heat spreader comprising an extension integrated with the divider segment that extends in a direction generally away from the cage and is configured to thermally communicate with the divider segment, the extension being configured to be engaged in thermal communication with a heat exchanger, wherein the first spring is configured to engage the first pluggable module when the first pluggable module is received within the first port such that the first spring is configured to press the first pluggable module in thermal communication with the module side of the divider segment of the internal heat spreader; and
an external heat spreader comprising a body having a cage segment that is configured to be mounted to the cage, such that the cage segment extends over at least a portion of the cage with a module side of the cage segment facing the second port, the body comprising an extension segment that extends from the cage segment, the extension segment being positioned behind the rear end and extending in a direction generally away from the cage, the extension segment having a first side being configured to be engaged in thermal communication with the heat exchanger behind the rear end of the cage, wherein the second spring is configured to engage the second pluggable module when the second pluggable module is received within the second port such that the second spring is configured to press the second pluggable module in thermal communication with the module side of the cage segment of the external heat spreader.

13. The receptacle assembly of claim 12, wherein the extension of the internal heat spreader comprises at least one extension rail that extends outward from the divider segment and through a wall of the cage in a direction generally away from the cage.

14. The receptacle assembly of claim 12, wherein the extension of the internal heat spreader comprises at least one extension rail that extends outward from the divider segment in a direction generally away from the cage, the divider segment being configured to thermally communicate with the heat exchanger at least partially through the at least one extension rail.

15. The receptacle assembly of claim 12, wherein the first spring is formed as a single, unitary structure with a wall of the cage that defines the first port.

16. The receptacle assembly of claim 12, wherein the divider comprises an opening that exposes the first port to the internal compartment of the divider, the module side of the divider segment of the internal heat spreader comprising a platform that is configured to extend into the opening of the divider, the platform having a module surface at which the divider segment is configured to be engaged in thermal communication with the first pluggable module.

17. The receptacle assembly of claim 12, wherein the extension segment of the external heat spreader extends from the cage segment, the extension segment being positioned behind a rear end of the cage and extending in the direction generally away from the cage, the extension segment being configured to be engaged in thermal communication with the heat exchanger.

18. A receptacle assembly comprising:
a cage comprising an interior cavity and a divider that divides the interior cavity into first and second ports, the cage having a rear end and a front end, the front end is open to the first and second ports, the first and second ports configured to receive first and second pluggable modules, respectively, therein through the front end, the divider comprising an internal compartment that extends between the first and second ports, the cage comprising a spring;

an external heat spreader comprising a body having a cage segment that is configured to be mounted to the cage such that the cage segment extends over at least a portion of the cage with a module side of the cage segment facing the second port, the body comprising an extension segment that extends from the cage segment, the extension segment being positioned behind the rear end and extending in a direction generally away from the cage; and an internal heat spreader configured to be mounted to the cage, the internal heat spreader comprising a divider segment that is configured to extend within the internal compartment of the divider with a module side of the divider segment facing the first port, the internal heat spreader comprising an extension, integrated with the divider segment, comprising an extension rail that extends outward from the divider segment and through the rear end of the cage, the extension rail being positioned behind the rear end and extending in a direction generally away from the cage, the extension being configured to be engaged in thermal communication with a heat exchanger behind the rear end of the cage, the divider segment being configured to thermally communicate with the heat exchanger at least partially through the extension rail, wherein the spring is configured to engage the first pluggable module when the first pluggable module is received within the first port such that the spring is configured to press the first pluggable module in thermal communication with the module side of the divider segment of the heat spreader.

19. The receptacle assembly of claim 18, wherein the extension segment is configured to be engaged in thermal communication with the heat exchanger, at least one extension rail being configured to be engaged in thermal communication with the extension segment to thermally communicate the divider segment to the heat exchanger.

20. The receptacle assembly of claim 18, the extension segment further comprising a first side and an opposite second side, the extension segment being configured to be engaged in thermal communication with the heat exchanger on the first side, at least one extension rail being configured to be engaged in thermal communication with the second side of the extension segment to thermally communicate the divider segment to the heat exchanger.

* * * * *